(12) United States Patent
Lu et al.

(10) Patent No.: US 6,348,817 B2
(45) Date of Patent: Feb. 19, 2002

(54) COMPLEMENTARY CURRENT MODE DRIVER FOR HIGH SPEED DATA COMMUNICATIONS

(76) Inventors: Jinghui Lu, 6017 Mordred La., Austin, TX (US) 78739; Edward K. F. Lee, 215 Sinclair Ave., #120, Ames, IA (US) 50014-7786

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/310,771

(22) Filed: May 10, 1999

(51) Int. Cl.$^7$ ................................................. H03B 1/00
(52) U.S. Cl. ........................ 327/108; 327/53; 323/315; 330/257
(58) Field of Search ................. 327/108, 112, 327/53, 66; 330/252, 257, 288; 323/315, 316

(56) References Cited

U.S. PATENT DOCUMENTS

| | | | |
|---|---|---|---|
| 4,797,583 A | | 1/1989 | Ueno et al. ................. 307/475 |
| 4,890,010 A | | 12/1989 | Neudeck et al. ............ 307/270 |
| 5,196,742 A | * | 3/1993 | McDonald .................... 327/65 |
| 5,384,769 A | | 1/1995 | Oprescu et al. .............. 370/24 |
| 5,418,478 A | | 5/1995 | Van Brunt et al. ........... 326/86 |
| 5,488,321 A | * | 1/1996 | Johnson ....................... 327/67 |
| 5,519,728 A | | 5/1996 | Kuo ............................ 375/257 |
| 5,528,185 A | * | 6/1996 | Lewicki et al. ............. 327/203 |
| 5,668,501 A | * | 9/1997 | Venes ......................... 330/254 |
| 5,726,592 A | * | 3/1998 | Schulte ........................ 327/65 |
| 5,767,699 A | | 6/1998 | Bosnyak et al. ............. 326/86 |
| 5,889,430 A | | 3/1999 | Csanky ....................... 327/543 |

FOREIGN PATENT DOCUMENTS

EP 0535951 A 4/1993

OTHER PUBLICATIONS

Fiedler, A., et al., "A 1.0625Gbps Transceiver with 2x–Pver-sampling and Transmit Signal Pre–Emphasis", ISSCC97/Session 15./Serial Data Communications/Paper FP 15.1, IEEE Solid State Circuit Conference, 238–239, (1997).

* cited by examiner

*Primary Examiner*—Timothy P. Callhan
*Assistant Examiner*—An T. Luu

(57) ABSTRACT

An integrated circuit driver provides, among other things, a high data communication rate, a large common mode output voltage range, avoidance of spikethrough current that increases power consumption, improved switching speed using current-steering techniques, and improved matching of steady-state output current in the high logic state to that of the low logic state. The driver includes complementary differential pairs and associated current mirror circuits that differentially source/sink current at a pair of load conductors to drive the load conductors into a logic state. A single-ended embodiment is also described.

37 Claims, 3 Drawing Sheets

COMPLEMENTARY CURRENT MODE DRIVER FOR HIGH SPEED DATA COMMUNICATIONS

TECHNICAL FIELD

This invention relates generally to data communications between electronic devices and particularly, but not by way of limitation, to a complementary current mode driver for high speed data communications.

BACKGROUND

Modem electronic devices such as computers, computer peripherals, network interfaces devices, cameras, communication equipment, audio and video devices, typically include integrated circuits that communicate at high data speeds with each other, and with integrated circuits located in other electronic devices. Such high speed data communication is essential for these electronic devices to provide useful functions to their users. Such integrated circuits often include an output driver circuit for transmitting data via one or more electrical conductors to a receiving circuit that is located on the same integrated circuit, on a different integrated circuit within the same electronic device, or on a different integrated circuit within a different electronic device.

A typical driver is implemented as a "push/pull" voltage mode amplifier having pullup and pulldown transistors controlled by one or more control signals. The pullup and pulldown transistors drive an electrical conductor (referred to as the load conductor), which communicates the signal to a receiver, into binary high and low logic voltage states, respectively. The pullup transistor sources a current to the load conductor, which drives its voltage toward the positive power supply voltage. The pulldown transistor sinks a current from the load conductor, which drives its voltage toward the negative power supply (or ground) voltage.

A push/pull voltage mode driver typically presents several problems for high speed data communications. For example, the pullup and pulldown transistors may have poor high frequency transconductance gain characteristics, so that their voltage gain begins to diminish at frequencies exceeding approximately 50 MHz, thereby limiting its high speed performance. Also, in a typical voltage mode driver, not all of the pullup and pulldown currents are delivered to the load conductor. For example, when driving the load conductor while in transition toward a binary high logic state, a portion of the pullup current is delivered to the load conductor, but another portion of the pullup current (i.e., spikethrough current) is sunk by the pulldown transistor. Similarly, when driving the load conductor while in transition toward a binary low logic state, a portion of the pulldown current is received from the load conductor, but another portion of the pulldown current (i.e., spikethrough current) is received from the pullup transistor. Spikethrough current increases the power consumption required to perform the switching.

Another problem with the traditional push/pull voltage mode amplifier is that the current required to drive a load to a particular voltage is inversely proportional to the load impedance. As a result, low impedance loads require increased power consumption. Because high speed data communications often involve a high dc current swing on the load conductor, however, the push/pull voltage mode driver provides poor matching of steady-state current in the binary high logic state to the steady-state current in the binary low logic state, particularly when an output common mode voltage is drastically increased or decreased. It would be desirable to have a consistent current consumption, which, in turn, would provide a consistent power consumption, when driving different loads. For these reasons, and for other reasons that will become apparent on reading this document and viewing the accompanying drawings that form a part thereof, there is a need for improved drivers for high speed data communications that offer improvements over such limitations.

SUMMARY

This document describes, among other things, a current-steering integrated circuit driver adapted for high speed data communications. The driver offers, among other things, a high data communication speed, a large common mode output voltage range, avoidance of spikethrough current that increases power consumption, improved switching switching speed using current-steering techniques, and improved matching of steady-state output current in the high logic state to that of the low logic state, even with large output common mode voltage swing.

In one embodiment, the integrated circuit driver includes a first current regulating circuit, adjusting a current delivered to a first current output based on a signal received at a first input. A first current mirror circuit provides a first output current to a first driver output based on a current received from the first current output of the first current regulating circuit. A second current regulating circuit adjusts a current delivered to a second current output based on a signal received at a second input. A second current mirror circuit provides a second output current to the first driver output based on a current received from the second current output of the second current regulating circuit.

In another embodiment, the integrated circuit driver includes a first current regulating circuit, steering a first input current to first and second current outputs based on signals received at first and second inputs. A first current mirror circuit provides a first output current to a first driver output based on a current received from the first current output. A second current mirror circuit provides a second output current to a second driver output based on a current received from the second current output. A second current regulating circuit steers a second input current to third and fourth current outputs based on signals received at third and fourth inputs. A third current mirror circuit provides a third output current to the first driver output based on a current received from the third current output of the second current steering circuit. A fourth current mirror circuit provides a fourth output current to the second driver output based on a current received from the fourth current output of the second current steering circuit. Other aspects of the invention will be apparent on reading the following detailed description of the invention and viewing the drawings that form a part thereof.

BRIEF DESCRIPTION OF THE DRAWINGS

In the drawings, like numerals describe substantially similar components throughout the several views, with alphabetic suffixes indicating different instances of the similar components.

DETAILED DESCRIPTION

Figure 1:
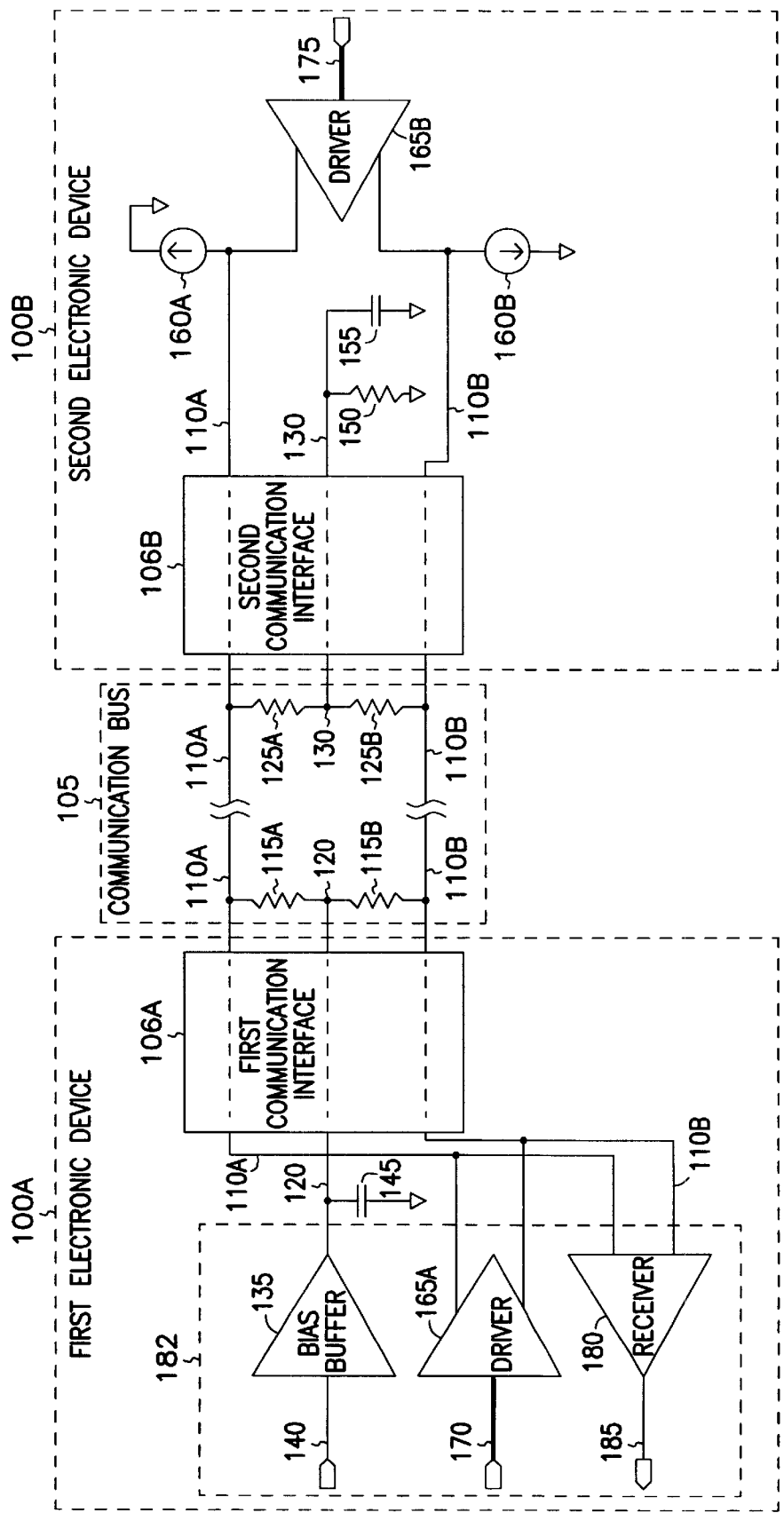
FIG. 1 is a schematic/block diagram illustrating generally one embodiment of portions of the present system (which includes a driver) and the environment in which it is used.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. The following detailed description is, therefore, not to be taken in a limiting sense, and the scope of the present invention is defined by the appended claims and their equivalents. In the drawings, like numerals describe substantially similar components throughout the several views.

This document describes, among other things, a current-steering integrated circuit driver adapted for high speed data communications. The driver offers, among other things, a high data communication rate, a large common mode output voltage range, avoidance of spikethrough current that increases power consumption, improved switching speed using current-steering techniques, and improved matching of steady-state output current in the high logic state to that of the low logic state, even with a large output common mode voltage swing.

System Overview

FIG. 1 is a schematic/block diagram illustrating generally, by way of example, but not by way of limitation, one embodiment of portions of the present system and the environment in which it is used. FIG. 1 illustrates a first electronic device 100A and a second electronic device 100B. Examples of such electronic devices include, but are not limited to, computers, computer peripherals, network interfaces devices, cameras, telephony and other communication equipment, audio and video devices. In one embodiment, device 100A is a computer and device 100B is a camera, such as a video camera. Devices 100A–B communicate data unidirectionally or bidirectionally over communication bus 105, such as at rates of approximately 400–800 megabits per second. In one embodiment, communication bus 105 is implemented as a cable between devices 100A–B, however, many other forms of communication bus 105 will be suitable. Devices 100A–B include respective first and second communication interfaces 106A–B, which are also referred to as communication ports. In one embodiment, interfaces 106A–B include suitable connectors and/or receptacles for interfacing with a cable communication bus 105, however, many other forms of interfaces 106A–B to various embodiments of communication bus 105 will be suitable.

In one embodiment, communication bus 105 includes a pair of conductors 110A–B for communicating a particular signal differentially. Communication bus 105 includes as many pairs of conductors as needed for communicating a particular number of signals between first and second electronic devices 100A–B. Alternatively, communication bus 105 communicates each signal single-endedly over a single conductor, using as many conductors as needed for communicating the particular number of signals between first and second electronic devices 100A–B.

Conductors 110A–B are coupled by respective resistors 115A–B (e.g., ≈55Ω) to a first common mode node 120, which is biased by circuits located in first electronic device 100A or elsewhere. Conductors 110A–B are also coupled by respective resistors 125A–B (e.g., ≈55Ω) to a second common mode node 130, which is biased by circuits in second electronic device 100B or elsewhere. In one embodiment, first common mode node 120 is biased at a stable bias voltage (e.g., ≈1.87 to 2.0 V) by bias buffer 135, based on a substantially constant input voltage signal received at input voltage node 140. Capacitor 145 (e.g., ≈0.3 μF) is coupled between first common mode node 120 and a ground voltage node to stabilize the dc voltage at first common mode node 120. In this embodiment, second common mode voltage 130 is biased by a voltage (e.g., ≈1.87 to 2.0 V) created across resistor 150 (e.g., ≈5 KΩ) and parallel capacitor 155 (e.g., ≅250 pF), each of which couple second common mode node 130 to ground.

Current sources 160A–B provide common mode current that, together with the stable bias voltage provided by bias buffer 135 at node 120, determines the common mode voltage at node 130. Nodes 120 and 130 are electrically connected through communication bus 105, such that the second common mode voltage at node 130 is also provided to node 120, allowing for resistive voltage drop arising from the wire length or cable length of communication bus 105. In one embodiment, first and second current sources 160A–B are used for signalling between first and second electronic devices 100A–B. For example, by using different combinations of currents of first and second current sources 160A–B, second electronic device 100B can provide information (e.g., switching speed, data format, etc.) to first electronic device 100A.

First and second electronic devices 100A–B include respective drivers 165A–B. When first electronic device 100A is transmitting data, driver 165A drives the load conductors at nodes 110A–B of communication bus 105 toward opposing binary high and low logic voltage levels based on signals received at input node/bus 170. (In this document, it is understood that logic states, including the binary high and low logic voltage levels, include any voltage levels that are sufficiently different such that they can be distinguished by a receiver. This includes both full rail-to-rail digital logic voltage swings, as well as much smaller signal swings such as, by way of example, but not by way of limitation, a 250 millivolt peak-to-peak signal swing between high and low logic voltage levels, where the signal swing is centered around 2.0 Volts or any other suitable center voltage. Thus, use of the terms "logic state," "logic level," "high" and "low" should not be interpreted as being limited to particular digital logic states, but should be broadly interpreted to include any signal level that can be detected and distinguished from at least one other signal level.) Similarly, when second electronic device 100B is transmitting data, driver 165B drives the load conductors at nodes 110A–B toward opposing binary high and low logic voltage levels based on signals received at input node/bus 175. At least one of first and second electronic devices 100A–B includes a receiver, such as receiver 180, which provides a digital output signal at node 185 based on a differential signal received across communication bus 105, such as at nodes 110A–B. In one embodiment, bias buffer 135, driver 165A, and receiver 180 are fabricated on the same integrated circuit 182.

Differential Driver Example

Figure 2:
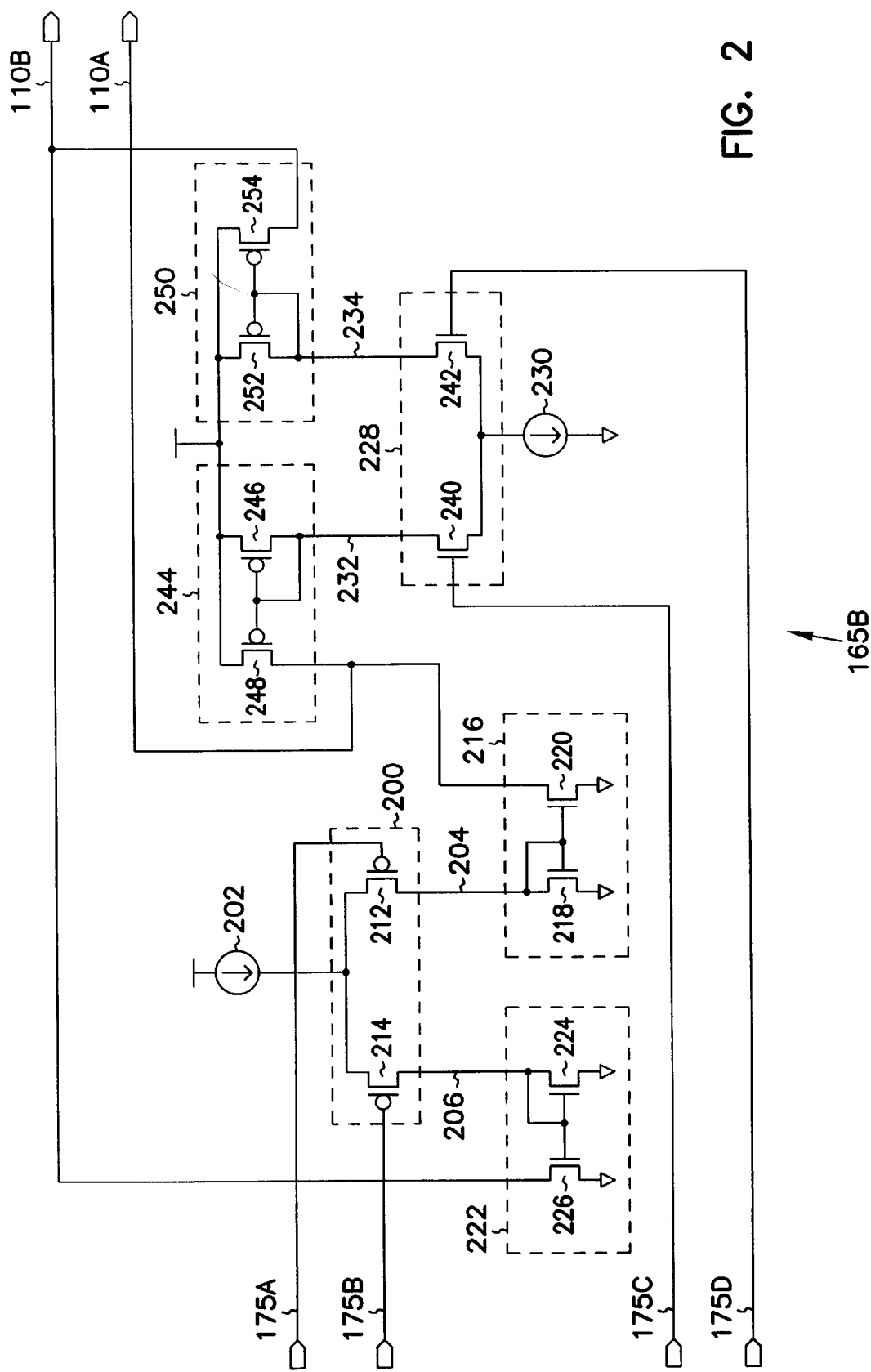
FIG. 2 is a schematic diagram illustrating generally one embodiment of a differential driver for driving a pair of load conductors.

FIG. 2 is a schematic diagram illustrating generally, by way of example, but not by way of limitation, one embodiment of integrated circuit driver 165B for differentially driving a pair of load conductors in communication bus 105, at first and second driver nodes 110A–B, respectively. In FIG. 2, driver 165B includes a first current regulating circuit, such as first current steering circuit 200, receiving a first input current from a first current source 202 and steering the first input current to first and second current outputs at nodes 204 and 206, respectively, based on signals received at first and second input nodes 175A and 175B, respectively. In one embodiment, first current steering circuit 200 includes a differential pair of transistors, such as p-channel field-effect transistor (PFET) 212 and PFET 214, which are coupled together at a common source terminal for receiving the first input current from first current source 202. PFET 212 steers a portion of the current received from first current source 202 along a path to the first current output at node 204 based on a signal received at its gate terminal at node 175A, along with a complementary signal received by PFET 214 at node 175B. PFET 214 steers a portion of the current received from first current source 202 along a path to the second current output at node 206 based on a signal received at its gate terminal at node 175B, along with a complementary signal received by PFET 212 at node 175A.

A first current mirror circuit 216 is coupled to the first current output, at node 204, of the first current steering circuit 200 for receiving a first output current. First current mirror circuit 216 provides a mirrored first output current to a first driver output, at node 110A, based on a current received from the first current output, at node 204, of the first current steering circuit 200. In one embodiment, first current mirror circuit 216 includes a diode-connected n-channel field-effect transistor (NFET) 218, including drain and gate terminals coupled, at node 204, to the drain terminal of PFET 212, and a source terminal coupled to ground. NFET 220 includes a gate terminal coupled to node 204, a source terminal coupled to ground, and a drain terminal coupled to the first driver output at node 110A.

In one embodiment, the current through each of PFETs 218 and 220 is approximately equal (e.g., the device dimensions of PFETS 218 and 220 are substantially identical, and PFET 218 includes the same number of parallel transistors as PFET 220). In another embodiment, the current through PFET 218 is different from (i.e., larger or smaller) than the current through PFET 220 (e.g., the device dimensions of PFET 218 is different from the device dimensions of PFET 220 and/or the number of parallel transistors of PFET 218 is different from the number of parallel transistors of PFET 220).

A second current mirror circuit 222 is coupled to the second current output, at node 206, of the first current steering circuit 200. Second current mirror circuit 222 provides a mirrored second output current to a second driver output, at node 110B, based on a current received from the second current output, at node 206, of the first current steering circuit 200. In one embodiment, second current mirror circuit 222 includes a diode-connected NFET 224, including drain and gate terminals coupled, at node 206, to the drain terminal of PFET 214, and a source terminal coupled to ground. NFET 226 includes a gate terminal coupled to node 206, a source terminal coupled to ground, and a drain terminal coupled to the second driver output at node 110B.

In one embodiment, the current through each of PFETs 224 and 226 is approximately equal (e.g., the device dimensions of PFETS 224 and 226 are substantially identical, and PFET 224 includes the same number of parallel transistors as PFET 226). In another embodiment, the current through PFET 224 is different from (i.e., larger or smaller) than the current through PFET 226 (e.g., the device dimensions of PFET 224 is different from the device dimensions of PFET 226 and/or the number of parallel transistors of PFET 224 is different from the number of parallel transistors of PFET 226).

A second current regulating circuit, such as second steering circuit 228, receives a second input current from a second current source 230, which sinks, rather than sources, current. Second current steering circuit 228 steers the second input current to third and fourth current outputs, at respective nodes 232 and 234, based on signals received at third and fourth inputs 175C and 175D, respectively. In one embodiment, second current steering circuit 228 includes a differential pair of transistors, such as NFET 240 and NFET 242, which are coupled together at a common source terminal for receiving the second input current sunk by second current source 230. NFET 240 steers a portion of the current received from second current source 230 along a path to the third current output at node 232 based on a signal received at its gate terminal at node 175C. NFET 242 steers a portion of the current received from second current source 230 along a path to the fourth current output at node 234 based on a signal received at its gate terminal at node 175D.

A third current mirror circuit 244 is coupled to the third current output, at node 232, of the second current steering circuit 228. Third current mirror circuit 244 provides a mirrored third output current to the first driver output, at node 110A, based on a current received from the third current output, at node 232, of the second current steering circuit 228. In one embodiment, third current mirror circuit 244 includes a diode-connected PFET 246, including drain and gate terminals coupled, at node 232, to the drain terminal of NFET 240, and a source terminal coupled to a power supply node (e.g., $\approx$2.7 to 3.6 V, nominal$\approx$3.3 V). PFET 248 includes a gate terminal coupled to node 232, a source terminal coupled to the power supply node, and a drain terminal coupled to the first driver output at node 110A.

In one embodiment, the current through each of NFETs 246 and 248 is approximately equal (e.g., the device dimensions of NFETS 246 and 248 are substantially identical, and NFET 246 includes the same number of parallel transistors as NFET 248). In another embodiment, the current through NFET 246 is different from (i.e., larger or smaller) than the current through NFET 248 (e.g., the device dimensions of NFET 246 is different from the device dimensions of NFET 248 and/or the number of parallel transistors of NFET 246 is different from the number of parallel transistors of NFET 248).

A fourth current mirror circuit 250 is coupled to the fourth current output, at node 234, of the second current steering circuit 228. Fourth current mirror circuit 250 provides a mirrored fourth output current to the second driver output, at node 100B, based on a current received from the fourth current output, at node 234, of the second current steering circuit 228. In one embodiment, fourth current mirror circuit 250 includes a diode-connected PFET 252, including drain and gate terminals coupled, at node 234, to the drain terminal of NFET 242, and a source terminal coupled to the power supply node. PFET 254 includes a gate terminal coupled to node 234, a source terminal coupled to the power supply node, and a drain terminal coupled to the second driver output at node 110B.

In one embodiment, the current through each of NFETs 252 and 254 is approximately equal (e.g., the device dimensions of NFETS 252 and 254 are substantially identical, and NFET 252 includes the same number of parallel transistors as NFET 254). In another embodiment, the current through NFET 252 is different from (i.e., larger or smaller) than the current through NFET 254 (e.g., the device dimensions of NFET 252 is different from the device dimensions of NFET 254 and/or the number of parallel transistors of NFET 252 is different from the number of parallel transistors of NFET 254).

In operation, first and second driver outputs, at respective nodes 110A–B, are differentially driven to opposite binary logic voltage states. In a first logic state, node 110A is driven high and node 110B is driven low by providing a logic high control signal to the first input, at node 175A, and the third input, at node 175C, and providing a logic low control signal to the second input, at node 175B, and the fourth input, at node 175D. In this first logic state, substantially all of the first input current is steered by PFET 214 to NFET 224, producing a resulting mirrored current, through NFET 226, sunk from node 110B. Substantially all of the second input current is steered by NFET 240 to PFET 246, producing a resulting mirrored current, sourced through PFET 248, to node 110A.

In a second logic state, node 110A is driven low and node 110B is driven high by providing a logic high control signal to the second input, at node 175B, and the fourth input, at node 175D, and providing a logic low control signal to the first input, at node 175A, and the third input, at node 175C. In this second logic state, substantially all of the first input current is steered by PFET 212 to NFET 218, producing a resulting mirrored current, through NFET 220, sunk from node 110A. Substantially all of the second input current is steered by NFET 242 to PFET 252, producing a resulting mirrored current, sourced through PFET 254 to node 110B.

Both of nodes 110A–B are placed in a high impedance state by providing a logic high control signal to first input node 175A and second input node 175B, and providing a logic low control signal to third input node 175C and fourth input node 175D. In this high impedance state, PFETS 212 and 214 are turned off, and the voltages of nodes 204 and 206 are actively pulled down to an NFET threshold voltage above ground, and are then further pulled toward the ground voltage by the subthreshold currents of NFETs 218 and 224, respectively. This results in NFETs 220 and 226 being turned off. Similarly, NFETs 240 and 242 are turned off, and the voltages of nodes 232 and 234 are actively pulled up to within a PFET threshold voltage of the power supply voltage, and are then further pulled toward the power supply voltage by the subthreshold currents of PFETs 246 and 252, respectively. This results in PFETs 248 and 254 being turned off. Operation and advantages of the driver 165B illustrated in FIG. 2 is discussed further below.

Single-Ended Driver Example

Figure 3:
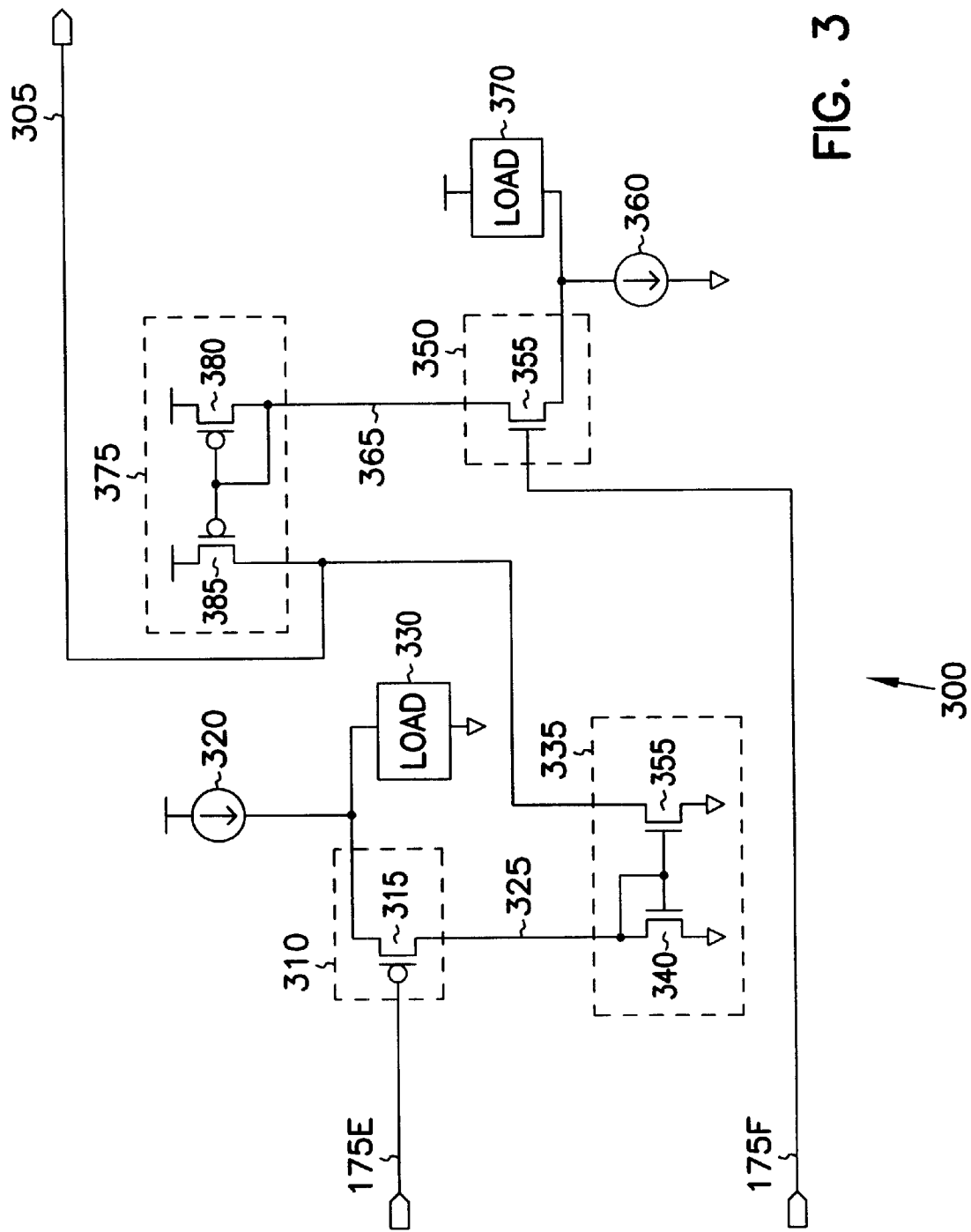
FIG. 3 is a schematic/block diagram illustrating generally one embodiment of a single-ended driver for driving a single load conductor.

FIG. 3 is a schematic/block diagram illustrating generally, by way of example, but not by way of limitation, one embodiment of driver 300 for driving a single load conductor 305 (such as one of conductors 110A–B) for single-ended data communication based on control signals received at first input node 175E and second input node 175F. In this embodiment, driver 300 includes a current regulating circuit 310 including, for example, a PFET 315, or other suitable transistor. PFET 315 receives a first input current from a first current source 320. PFET 315 adjusts a current delivered to a first current output, at node 325, based on a signal received at first input node 175E. In one embodiment, current regulating circuit 310 is also coupled to a load 330, such as a FET, a resistor, etc., for sinking a portion of the current from first current source 320 that is not steered along a path to the first current output at node 325. In one example, load 330 includes a PFET operated as a differential pair current steering circuit together with PFET 315.

Driver 300 also includes a first current mirror circuit, such first current mirror circuit 335 including n-channel field-effect transistors (NFETs). Current mirror circuit 335 is coupled to the first current output, at node 325, of the first current regulating circuit 310. Current mirror circuit 335 provides a first output current (e.g., a pulldown current) to a first driver output, at node 305, based on the current received from the first current output, at node 325, of the first current regulating circuit 310. In one embodiment, first current mirror circuit 335 includes a diode-connected NFET 340, including drain and gate terminals coupled, at node 325, to the drain terminal of PFET 315, and a source terminal coupled to ground. NFET 355 includes a gate terminal coupled to node 325, a source terminal coupled to ground, and a drain terminal coupled to load conductor 305.

In one embodiment, the current through each of PFETs 340 and 355 is approximately equal (e.g., the device dimensions of PFETS 340 and 355 are substantially identical, and PFET 340 includes the same number of parallel transistors as PFET 355). In another embodiment, the current through PFET 340 is different from (i.e., larger or smaller) than the current through PFET 355 (e.g., the device dimensions of PFET 340 is different from the device dimensions of PFET 355 and/or the number of parallel transistors of PFET 340 is different from the number of parallel transistors of PFET 355).

Driver 300 also includes a second current regulating circuit 350, including an NFET 355. NFET 355 receives a second input current from a second current source 360 which, in this embodiment, sinks current from transistor 355. NFET 355 adjusts a current sunk at a second current output, at node 365, based on a signal received at second input 175F. In one embodiment, second current regulating circuit 350 is also coupled to a load 370, such as a FET, a resistor, etc., for accommodating a portion of the current sunk by second current source 360 that is not steered along a path to the second current output at node 365. In one example, load 370 includes an NFET operated as a differential pair current steering circuit together with NFET 355.

Driver 300 also includes a second current mirror circuit, such as current mirror circuit 375, including PFETs. Current mirror circuit 375 is coupled to the second current output, at node 365, of second current regulating circuit 350. Current mirror circuit 375 provides a second output current to the load conductor, at node 305, based on a current received from the second current output, at node 365, of the second current regulating circuit 350. In one embodiment, second current mirror circuit 375 includes a diode-connected PFET 380, including drain and gate terminals coupled, at node 365, to the drain terminal of PFET 355, and a source terminal coupled to the positive power supply. PFET 385 includes a gate terminal coupled to node 365, a source terminal coupled to the positive power supply, and a drain terminal coupled to load conductor 305.

In one embodiment, the current through each of NFETs 380 and 385 is approximately equal (e.g., the device dimensions of NFETS 380 and 385 are substantially identical, and NFET 380 includes the same number of parallel transistors as NFET 385). In another embodiment, the current through NFET 380 is different from (i.e., larger or smaller) than the current through NFET 385 (e.g., the device dimensions of NFET 380 is different from the device dimensions of NFET 385 and/or the number of parallel transistors of NFET 380 is different from the number of parallel transistors of NFET 385).

In operation, load conductor 305 is driven high when nodes 175E and 175F are both high, and driven low when nodes 175E and 175F are both low, and driven to a high impedance state when node 175E is high and 175F is low.

It is understood that multiple instances of driver 300 can be used for single-endedly driving multiple load conductors (such as node 110A or node 110B) of communication bus 105. Alternatively, multiple instances of driver 300 are paired for differentially driving multiple pairs of load conductors (such as node pair 110A–B) of communication bus 105. By placing opposite logic states on corresponding inputs of each instance of driver 300 in such a pair of single-ended drivers, each corresponding output load conductor 305 is driven to a logic state that is opposite of another output load conductor in the pair of load conductors.

Each of the drivers illustrated in FIGS. 2 and 3 can tolerate a large output voltage range. In the example illustrated in FIG. 2, where the positive power supply voltage is $V_{DD}$, the output voltage at node 110A is limited only by the minimum drain-source voltages required to keep PFET 248 and NFET 220 operating in their respective "saturation" regions of operation. Similarly, the output voltage at node 110B is limited only by the minimum drain source voltages required to keep PFET 254 and NFET 226 in their respective "saturation" regions of operation. Moreover, PFETs 248 and 254 and NFETs 220 and 226 are operated as current sources. As a result, the minimum drain-source voltage required to operate in their saturation regions is approximately equal to a saturation voltage ($V_{DS(SAT)} = V_{GS} - V_T$), as a result of having gates biased by respective diode-connected transistors. This is less than if these transistors were being operated as transconductance switches, which typically have a much larger applied gate-source voltage (i.e., the full power supply voltage). Thus, the present drivers can tolerate a wider output voltage swing (while still maintaining a substantially constant load current) than typical push/pull voltage mode driver using pullup and pulldown transconductors operated as switches. In one example, for the positive power supply voltage $V_{DD} \approx 3.0$ V, nodes 110A–B can be driven between approximately 0.5 V to 2.5 V.

Each of the drivers illustrated in FIGS. 2 and 3 also provides improved frequency response over a comparable push/pull voltage transconductor driver. It also avoids the spikethrough current of push/pull transconductor. Furthermore, it offers improved matching of steady-state output current in the high logic state to that of the low logic state, as compared to a push/pull voltage transconductor driver. In a push/pull voltage transconductor driver, steady-state currents depend on device dimensions (e.g., transistor width and length) and process transconductance characteristics, which can vary significantly between devices, particularly between PFET and NFET devices. By contrast, using the present driver, the current sources used to establish the steady-state output currents are limited only by the accuracy of the reference current source and the matching of the current mirrors, making it easier to more closely match the logic high steady-state current to the logic low steady-state current.

CONCLUSION

The above-described system provides, among other things, an integrated circuit driver adapted for high speed data communications. The driver offers, among other things, a high data communication rate, a large common mode output voltage range, avoidance of spikethrough current that increases power consumption, improved switching speed using current-steering techniques, and improved matching of steady-state output current in the high logic state to that of the low logic state.

Although the present integrated circuit driver is discussed above in the context of communicating to a receiver located on a different integrated circuit in a different electronic device, it is understood that the present driver is also used for communication with a receiver located on a different integrated circuit within the same electronic device, or with a receiver located on the same integrated circuit regardless of whether it is embodied within an electronic device.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An integrated circuit driver comprising:
    a first current regulating circuit, adjusting a current delivered to a first current output based on a signal received at a first input;
    a first current mirror circuit, providing a first output current to a first driver output based on the current received from the first current output of the first current regulating circuit;
    a second current regulating circuit, adjusting a current delivered to a second current output based on a signal received at a second input and independent of the signal received at the first input; and
    a second current mirror circuit, providing a second output current to the first driver output based on the current received from the second current output of the second current regulating circuit.

2. The driver of claim 1, in which at least one of the first and second current regulating circuits includes a current steering circuit having two current paths.

3. The driver of claim 1, in which:
    the first current regulating circuit adjusts a current delivered to a third current output based on a signal received at a third input; and
    the second current regulating circuit adjusts a current delivered to a fourth current output based on a signal received at a fourth input.

4. The driver of claim 3, further including:
    a third current mirror circuit, providing a third output current to a second driver output based on the current received from the third current output of the first current regulating circuit; and
    a fourth current mirror circuit, providing a fourth output current to the second driver output based on the current received from the fourth current output of the second current regulating circuit;
    means for performing the function of providing a first output current to the first driver output based on the first current output of the first current regulating circuit and the third current output of the second current regulating circuit; and
    means for performing the function of providing a second output current to the second driver output based on the second current output of the first current regulating circuit and the fourth current output of the second current regulating circuit.

5. The driver of claim 1, wherein the first and second current mirror circuits provide approximate unity gains.

6. An integrated circuit driver comprising:
    a first current regulating circuit which steers a first input current to first and second current outputs based on signals received at first and second inputs;

a first current mirror circuit providing a first output current to a first driver output based on a current received from the first current output of the first current regulating circuit;

a second current mirror circuit providing a second output current to a second driver output based on a current received from the second current output of the first current regulating circuit;

a second current regulating circuit which steers a second input current to third and fourth current outputs based on signals received at third and fourth inputs;

a third current mirror circuit providing a third output current to the first driver output based on a current received from the third current output of the second current regulating circuit; and a fourth current mirror circuit, providing a fourth output current to the second driver output based on a current received from the fourth current output of the second current regulating circuit.

7. The integrated circuit driver of claim 6, in which the first current regulating circuit includes a first differential pair of transistors.

8. The integrated circuit driver of claim 7, in which the second current regulating circuit includes a second differential pair of transistors.

9. The integrated circuit driver of claim 8, in which the first and third inputs are each coupled to the same logic voltage level when the integrated circuit driver is driving the first driver output to binary high and low logic states.

10. The integrated circuit driver of claim 9, in which the second and fourth inputs are each coupled to the same logic voltage level when the integrated circuit driver is driving the second driver output to binary high and low logic states.

11. The integrated circuit driver of claim 10, in which the first and third inputs are each coupled to different logic voltage levels when the integrated circuit driver is driving the first driver output to high impedance state, and the second and fourth inputs are each coupled to different logic voltage levels when the integrated circuit driver is driving the second driver output to high impedance state.

12. An integrated circuit driver comprising:
a first current source, sourcing a first input current;
a p-channel first input transistor, including a source coupled to receive the first input current from the first current source, a gate that receives a first input voltage, and a drain;
a p-channel second input transistor, including a source coupled to the source of the first input transistor, a gate that receives a second input voltage, and a drain;
an n-channel first load transistor, including a gate and drain coupled to the drain of the first input transistor, and a source coupled to a ground voltage;
an n-channel second load transistor, including a gate and drain coupled to the drain of the second input transistor, and a source coupled to a ground voltage;
an n-channel first current mirror transistor, including a gate coupled to the gate of the first load transistor, a source coupled to the ground node, and a drain coupled to a first driver output terminal;
an n-channel second current mirror transistor, including a gate coupled to the gate of the second load transistor, a source coupled to the ground node, and a drain coupled to a second driver output terminal;
a second current source, sinking a second input current;
an n-channel third input transistor, including a source coupled to receive the second input current from the second current source, a gate that receives a third input voltage, and a drain;
an n-channel fourth input transistor, including a source coupled to the source of the third input transistor, a gate that receives a fourth input voltage, and a drain;
a p-channel third load transistor, including a gate and drain coupled to the drain of the third input transistor, and a source coupled to a power supply node;
a p-channel fourth load transistor, including a gate and drain coupled to the drain of the fourth input transistor, and a source coupled to the power supply node;
a p-channel third current mirror transistor, including a gate coupled to the gate of the third load transistor, a source coupled to the power supply node, and a drain coupled to the first driver output terminal; and
a p-channel fourth current mirror transistor, including a gate coupled to the gate of the fourth load transistor, a source coupled to the power supply node, and a drain coupled to the second output terminal.

13. An integrated circuit driver comprising:
first and second driver outputs;
a first current regulating circuit, including first and second inputs and first and second current outputs, the first current regulating circuit steering a first input current to the first and second current outputs based on signals received at the first and second inputs;
a second current regulating circuit, including third and fourth inputs and third and fourth outputs, the second current regulating circuit steering a second input current to the third and fourth current outputs based on signals received at the third and fourth inputs;
a means for performing the function of providing a first output current to the first driver output based on the first current output of the first current regulating circuit and the third current output of the second current regulating circuit; and
a means for performing the function of providing a second output current to the second driver output based on the second current output of the first current regulating circuit and the fourth current output of the second current regulating circuit.

14. A system comprising:
a first electronic device, including:
a first communication port, having first and second communication port terminals;
a first driver, including:
a first current regulating circuit, including first and second inputs and first and second current outputs, the first current regulating circuit steering a first input current to the first and second current outputs based on signals received at the first and second inputs;
a first current mirror circuit, providing a first output current to the first communication port terminal based on a current received from the first current output;
a second current mirror circuit, providing a second output current to the second communication port terminal based on a current received from the second current output;
a second current regulating circuit, including third and fourth inputs and third and fourth current outputs, the second current regulating circuit steering a second input current to the third and fourth current outputs based on signals received at the third and fourth inputs;

a third current mirror circuit, providing a third output current to the first communication port terminal based on a current received from the third current output; and a fourth current mirror circuit, providing a fourth output current to the second communication port terminal based on a current received from the fourth current output;

a second electronic device, including a second communication port having third and fourth communication port terminals; and a bus, coupling the first and second electronic devices, the bus including:

a first connection path between the first communication port terminal and the third communication port terminal; and a second connection path between the second communication port terminal and the fourth communication port terminal.

15. The system of claim 14, in which the first electronic device includes:

a first resistor, coupling the first communication port terminal to a first bias node; and a second resistor, coupling the second communication port terminal to the first bias node.

16. The system of claim 15, in which the second electronic device includes:

a third resistor, coupling the third communication port terminal to a second bias node; and a fourth resistor, coupling the fourth communication port terminal to the second bias node.

17. The system of claim 16, further including a first bias voltage source coupled to a first one of the first and second bias nodes.

18. The system of claim 17, further comprising a first capacitor coupled to the first one of the first and second bias nodes.

19. The system of claim 16, further including:

a third current source, coupled to one of the first and third communication port terminals; and a fourth current source, coupled to one of the second and fourth communication port terminals.

20. The system of claim 19, further comprising:

a fifth resistor, coupling the second bias node to a ground node; and a second capacitor, coupling the second bias node to the ground node.

21. The system of claim 19, in which the first electronic device includes a camera and the second electronic device includes a computer.

22. The system of claim 19, in which the first electronic device includes a computer and the second electronic device includes a camera.

23. The system of claim 14, wherein each current mirror circuit provides an approximate unity gain.

24. A method of communicating across a bus including first and second bus connections, the method comprising:

steering, based on first and second input voltages, a first component of a first input current along a first path and a second component of the first input current along a second path;

providing a first output current to the first bus connection based on the first component of the first input current;

providing a second output current to the second bus connection based on the second component of the first input current;

steering, based on third and fourth input voltages, a first component of a second input current along a third path and a second component of the second input current along a fourth path, wherein the third and fourth input voltages are provided independent of the first and second bus connections;

providing a third output current to the first bus connection based on the first component of the second input current; and providing a fourth output current to the second bus connection based on the second component of the second input current.

25. The method of claim 24, including receiving the same first and third input voltages when the first bus connection is being driven toward binary high and low logic states.

26. The method of claim 25, including receiving the same second and fourth input voltages when the second bus connection is being driven toward binary high and low logic states.

27. The method of claim 26, including receiving different first and third input voltages when the first bus connection is being driven toward high impedance state, and receiving different second and fourth input voltages when the second bus connection is being driven toward high impedance state.

28. An integrated circuit driver comprising:

first and second driver outputs;

first means, responsive to a first pair of voltage inputs, for sinking current through the first or the second driver output; and second means, responsive to a second pair of voltage inputs, for sourcing current through the first or second driver output, wherein the second means sources current independent of the first pair of voltage inputs.

29. The driver of claim 28 wherein the first and second means are responsive to certain values of voltage inputs to set the first and second driver outputs in respective high-impedance states.

30. An integrated circuit driver comprising:

first and second supply nodes;

first and second driver inputs;

first and second driver outputs;

first and second current steering circuits each coupled to the first and second driver outputs and each coupled respectively to the first and second driver inputs; and first and second reference current providers, with the first reference current provider coupled between the first current steering circuit and the first supply node and the second reference current coupled between the second supply node and the second current steering circuit.

31. The driver of claim 30, wherein each current steering circuit comprises a pair of current mirror circuits.

32. The driver of claim 30, wherein the first and second current steering circuits comprise respective first and second differentially coupled transistor pairs, with the first differentially coupled transistor pair having a different conductivity type than the second differentially coupled transistor pair.

33. The driver of claim 32, wherein the first current steering circuit further comprises first and second current mirror circuits having respective current mirror inputs and outputs, with the input and output of the first current mirror circuit coupled between the first driver output and one of the first differentially coupled transistors, and with the input and output of the second current mirror circuit coupled between the second driver output and the other of the first differentially coupled transistors.

34. The driver of claim 30, further comprising third and fourth inputs coupled respectively to the first and second current steering circuits.

35. An interface device for coupling to an external electronic device, the interface device comprising at least one integrated circuit driver comprising;
- a first cur,-rent regulating circuit which steers a first input current to first and second current outputs based on signals received at first and second inputs;
- a first current mirror circuit providing a first output current to a first driver output based on a current received from the first current output of the first current regulating circuit;
- a second current mirror circuit providing a second output current to a second driver output based on a current received from the second current output of the first current regulating circuit;
- a second current regulating circuit which steers a second input current to third and fourth current outputs based on signals received at third and fourth inputs;
- a third current mirror circuit providing a third output current to the first driver output based on a current received from the third current output of the second current regulating circuit; and
- a fourth current mirror circuit, providing a fourth output current to the second driver output based on a current received from the fourth current output of the second current regulating circuit.

36. An electronic device including an interface device for coupling to an external electronic device, the interface device comprising at least one integrated circuit driver comprising:
- a first current regulating circuit which steers a first input current to first and second current outputs based on signals received at first and second inputs;
- a first current mirror circuit providing a first output current to a first driver output based on a current received from the first current output of the first current regulating circuit;
- a second current mirror circuit providing a second output current to a second driver output based on a current received from the second current output of the first current regulating circuit;
- a second current regulating circuit which steers a second input current to third and fourth current outputs based on signals received at third and fourth inputs;
- a third current mirror circuit providing a third output current to the first driver output based on a current received from the third current output of the second current regulating circuit; and
- a fourth current mirror circuit, providing a fourth output current to the second driver output based on a current received from the fourth current output of the second current regulating circuit.

37. A system comprising:
- an electronic device including an interface device for coupling to an external electronic device, the interface device comprising at least one integrated circuit driver comprising:
  - a first current regulating circuit which steers a first input current to first and second current outputs based on signals received at first and second inputs;
  - a first current mirror circuit providing a first output current to a first driver output based on a current received from the first current output of the first current regulating circuit;
  - a second current mirror circuit providing a second outputs current to a second driver output based on a current received from the second current output of the first current regulating circuit;
  - a second current regulating circuit which steers a second input current to third and fourth current outputs based on signals received at third and fourth inputs;
  - a third current mirror circuit providing a third output current to the first driver output based on a current received from the third current output of the second current regulating circuit; and
  - a fourth current mirror circuit, providing a fourth output current to the second driver output based on a current received from the fourth current output of the second current regulating circuit;
- another electronic device having first and second device terminals; and
- a communication bus having first and second conductors, with the first conductor coupled between the first driver output of the one integrated circuit driver in the electronic device and the first device terminal and the second conductor coupled between the second driver output of the one integrated circuit driver in the electronic device and the second device terminal.

* * * * *